United States Patent
Murillo et al.

(10) Patent No.: US 7,730,273 B2
(45) Date of Patent: Jun. 1, 2010

(54) METHOD FOR SECURING DATA BLOCKS IN AN ELECTRICALLY PROGRAMMABLE MEMORY

(75) Inventors: Laurent Murillo, Marseilles (FR); Philippe Ganivet, Bouc Bel Air (FR)

(73) Assignee: STMicroelectronics SA, Montrouge (FR)

( * ) Notice: Subject to any disclaimer, the term of this patent is extended or adjusted under 35 U.S.C. 154(b) by 514 days.

(21) Appl. No.: 11/784,210

(22) Filed: Apr. 4, 2007

(65) Prior Publication Data
US 2007/0245109 A1    Oct. 18, 2007

(30) Foreign Application Priority Data
Apr. 7, 2006    (FR) ................... 06 03074

(51) Int. Cl.
G06F 12/00 (2006.01)
G06F 13/00 (2006.01)
G06F 13/28 (2006.01)
G11C 7/00 (2006.01)
G11C 8/00 (2006.01)

(52) U.S. Cl. .................. 711/163; 711/103; 711/154; 365/222; 365/239

(58) Field of Classification Search .................. 711/163
See application file for complete search history.

(56) References Cited

U.S. PATENT DOCUMENTS

| | | | | |
|---|---|---|---|---|
| 5,991,197 A | 11/1999 | Ogura et al. | ........... | 365/185.11 |
| 6,249,456 B1 | 6/2001 | Chehadi | ........... | 365/185.2 |
| 6,310,827 B1 | 10/2001 | Fuentes | ........... | 365/239 |
| 2002/0191465 A1* | 12/2002 | Maayan et al. | ........... | 365/222 |
| 2004/0177212 A1* | 9/2004 | Chang et al. | ........... | 711/103 |

FOREIGN PATENT DOCUMENTS

| EP | 1006532 A1 | 6/2000 |
|---|---|---|
| EP | 0 874 369 B1 | 7/2002 |

OTHER PUBLICATIONS

Tanenbaum, Andrew. Structured Computer Organization.1984. Prentice Hall, Inc. pp. 10-12.*

* cited by examiner

*Primary Examiner*—Christian P Chace
*Assistant Examiner*—Ryan Bertram
(74) *Attorney, Agent, or Firm*—Lisa K. Jorgenson; Robert Iannucci; Seed IP Law Group PLLC

(57) ABSTRACT

A method for securing a memory area comprising data blocks, wherein at least two control bits are associated with each data block, is provided. The method comprises a step of reading the control bits associated with a current data block intended to be replaced with the new data block, before the writing of a new data block in the memory area. A securing action for securing the memory area is begun if the two control bits have the same value. Upon each write of a new data block in the memory area, control bits having opposite values are written in the memory area. The method may be applied, for example, to the securization of a binary counter.

24 Claims, 2 Drawing Sheets

Fig. 1
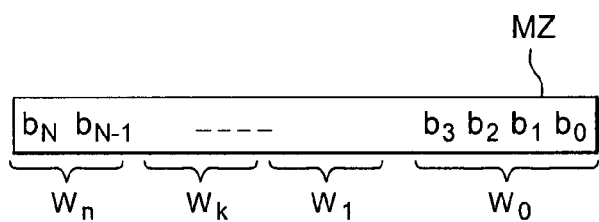
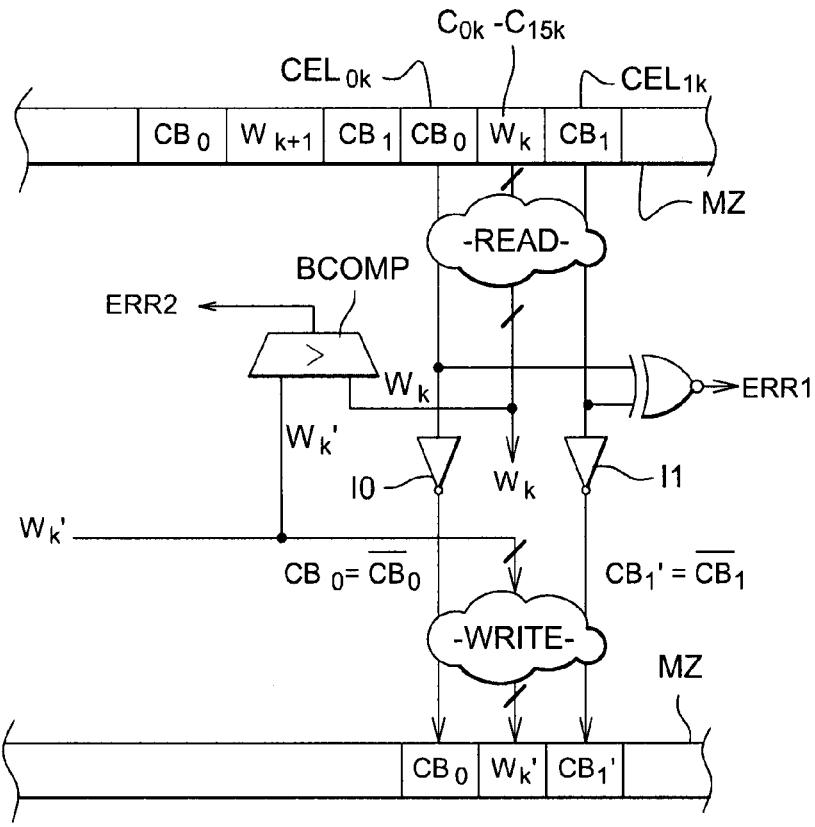
Fig. 2
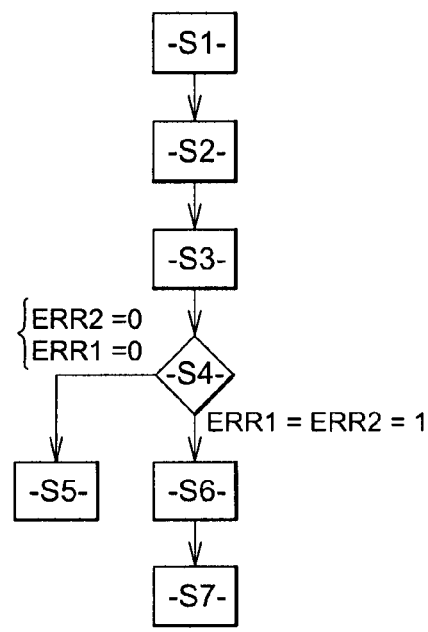
Fig. 4

METHOD FOR SECURING DATA BLOCKS IN AN ELECTRICALLY PROGRAMMABLE MEMORY

BACKGROUND OF THE INVENTION

1. Field of the Invention

The present invention relates to a method for securing a memory area comprising data blocks, and an electronic circuit comprising groups of memory cells each receiving a data block, and means for executing a command for writing a data block in a group of memory cells.

The present invention relates to the securization of a binary counter implemented on an integrated circuit, such as integrated circuits for odometers of motor vehicles.

The present invention also relates to the securization of integrated circuits used to manage transaction data, such as integrated circuits for smart cards of electronic cash card, telephone card, transportation pass, etc.

2. Description of the Related Art

Transaction or counting data generally have a tangible monetary value, whether the data is transaction data enabling a service to be accessed or counting data of an odometer enabling the value of a vehicle to be established. As a result, the integrated circuits comprising such data are often the target of fraudsters who try to falsify or refresh these data.

The memories used to store this type of data are non-volatile memories generally of the electrically programmable and erasable type. Thus, a fraudster who wishes to refresh the value of a transaction unit counter or of a binary counter will generally try to erase memory cells that are in the programmed state so that all or part of the units of the counter are reset to 0. The erasing technique most frequently used is the collective erasing of the memory cells, by exposing the memory to a beam of particles, generally a UV beam (beam of ultra-violet light). The exposure to the UV light results in electric charges being extracted from the memory cells and put into a blank electrical state corresponding generally, when read, to the erased state.

A solution to counter this type of fraud, described by EP 1 006 532, is to provide a control memory cell that is put into an initial, erased or programmed state, and is then read with two read voltages so as to detect whether the memory cell is in the initial state or in an intermediate state corresponding to the UV state. This solution has the disadvantage of needing two read voltages, one being a "standard" read voltage and the other one allowing whether or not the memory cell is in the UV state to be detected.

Moreover, this solution does not counter certain types of fraud such as the corruption of the read process, which enables protection mechanisms intervening at the time of reading data to be inhibited, or the corruption of the writing process, enabling counterfeit data to be written in a memory.

BRIEF SUMMARY OF THE INVENTION

Thus, in one embodiment, a method of securing data based on the use of a control memory cell is provided.

In one embodiment, a method to secure a binary counter in a more secure manner than the known methods is provided.

In one embodiment, a method for securing a memory area comprising data blocks, comprises the steps of associating at least two control bits with each data block; before the writing of a new data block in the memory area, reading in the memory area the control bits associated with a current data block intended to be replaced with the new data block, and beginning a securing action for securing the memory area if the two control bits have the same value; and upon each write of a new data block in the memory area, simultaneously writing in the memory area control bits having opposite values.

According to one embodiment, each control bit written in the memory area during the writing of a new data block has a value that is the opposite of that of the corresponding control bit read in the memory area before the writing of the new data block.

According to one embodiment, the securing action comprises the fact of preventing the new data block from being written in the memory area.

According to one embodiment, the securing action comprises the supply of an error signal or of an error message.

According to one embodiment, the control bits associated with a data block are written in memory cells that are contiguous to a group of memory cells receiving the associated data block.

According to one embodiment, a memory cell receiving a control bit is arranged at one end of the group of memory cells receiving the associated data block and a memory cell receiving the other control bit is arranged at another end of the group of memory cells receiving the associated data block.

According to one embodiment, the method comprises a step of initializing the memory area involving writing in the memory area groups of at least two control bits each associated with a data block, by giving two control bits of a same group opposite values.

In another embodiment, a method for securing a string of bits in a non-volatile memory area is provided. The method comprising the steps of breaking down the string of bits into a plurality of data blocks, and securing each data block in accordance with the method for securing a memory area described above.

According to one embodiment, the string of bits forms a binary counter, and the method comprises the steps of simultaneously reading in the memory area the current data block and the two associated control bits before the writing of a new data block in the memory area, and beginning the securing action for securing the memory area if at least one of the two following conditions is encountered: 1) the two control bits have the same value, 2) the value of the new data block is not different from the value of the current data block according to a determined variation direction of the counter.

In yet another embodiment, an electronic circuit is provided comprising a secured memory area comprising groups of memory cells each receiving a data block, means for executing a write command for writing a data block in a group of memory cells designated by the command, in which the memory area comprises, for each data block, at least two control memory cells associated with the group of memory cells receiving the data block, the circuit comprising securing means arranged for: before the writing of a new data block in a group of memory cells designated by a command, reading the control memory cells associated with the group of memory cells, and beginning a securing action for securing the memory area if two bits read in the control memory cells have the same value, and upon each write of a data block in a group of memory cells designated by a command, simultaneously writing in the control memory cells associated with the group of memory cells at least two bits having opposite values.

According to one embodiment, the securing means are arranged for, upon each write of a data block in a group of memory cells, writing in each control memory cell associated with the group of memory cells, a bit having a value that is the opposite of that of the bit read in the control memory cell before the writing of the data block.

According to one embodiment, the securing means are arranged for beginning a securing action comprising the fact of preventing the data block from being written in the memory area.

According to one embodiment, the securing means are arranged for beginning a securing action comprising the supply of an error signal or of an error message.

According to one embodiment, the control memory cells are contiguous to the group of memory cells receiving the associated data block.

According to one embodiment, a control memory cell is arranged at one end of the associated group of memory cells and a memory cell receiving the other control bit is arranged at another end of the associated group of memory cells.

According to one embodiment, the electronic circuit comprises a string of bits forming a binary counter, broken down into a plurality of data blocks, and means for managing the binary counter including said securing means.

According to one embodiment, the means for managing the binary counter are arranged for: before each write of a new data block in a group of memory cells designated by a command, reading the group of memory cells designated by the command and the control memory cells associated with the group of memory cells, and beginning the securing action for securing the memory area if at least one of the two following conditions is encountered: 1) two bits present in the control memory cells have the same value, 2) the value of the new data block is not different from the current value of the data block read in the group of memory cells, according to a determined variation direction of the counter.

In another embodiment, an integrated circuit on a semiconductor is provided comprising an electronic circuit that performs the disclosed method.

In another embodiment, a smart card comprising an integrated circuit is provided that performs the disclosed method.

In another embodiment, an electronic counter is provided comprising an integrated circuit that performs the disclosed method.

BRIEF DESCRIPTION OF THE SEVERAL VIEWS OF THE DRAWINGS

FIG. 1 schematically represents a classic memory area comprising a string of bits forming a binary counter.

FIG. 2 schematically shows the application of the method according to one embodiment to the string of bits in FIG. 1.

FIG. 4 is a flowchart showing the implementation of the method according to one embodiment in the circuit in FIG. 3.

DETAILED DESCRIPTION OF THE INVENTION

Figure 3:
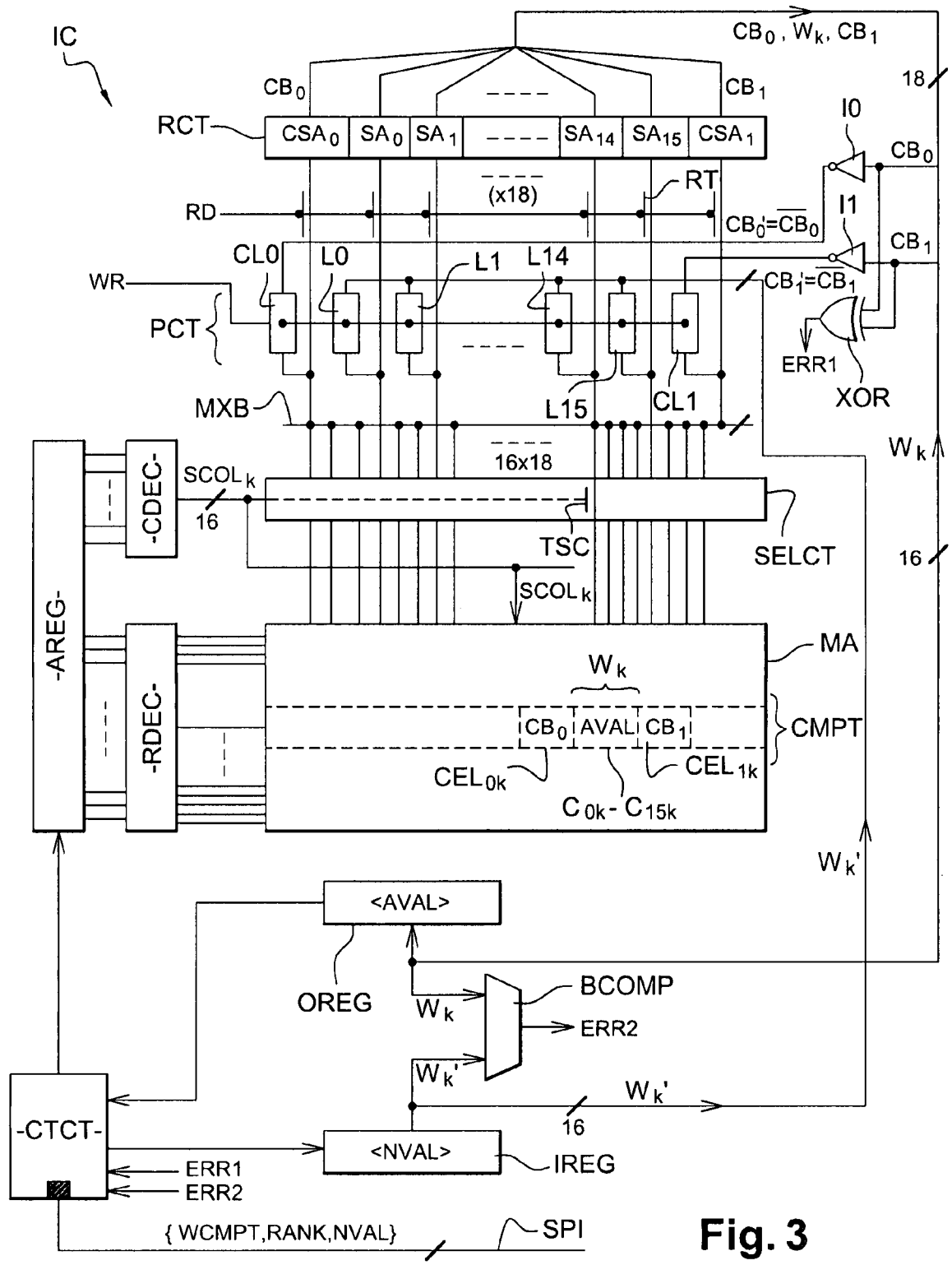
FIG. 3 represents the architecture of an electronic circuit comprising an electrically erasable and programmable memory and securing means according to one embodiment.

As an example of implementation of the method according to one embodiment, a string of bits b0, b1, b3 . . . bN as represented in FIG. 1 will be considered and it will be assumed that the string of bits forms a binary counter the content of which must be modified from time to time to receive a new counting value. The string of bits is stored in a memory area MZ of electrically erasable and programmable type. The string of bits is broken down into a plurality of words or data blocks Wk of rank k (W0, W1, . . . , Wk, . . . Wn) each comprising a same number of bits, for example 16 bits, each bit being stored by a memory cell.

Upon each refresh, a new data block must be written in the memory area at the place of a previous data block. To overcome the risk of fraud involving writing in the counter a data block with a value lower than the previous data block (case of a counter with increasing values), the new data block is compared with the previous data block and is only written in the counter if it has a value greater than the latter.

For example, if the current value of the counter is as follows:

| Wn | Wk | W1 | W0 |
|---|---|---|---|
| 00000-0 | 00111-1 | 11111-1 | 11111-1 | and if the next value of the counter is the following value:

| Wn | Wk' | W1 | W0 |
|---|---|---|---|
| 00000-0 | 10001-1 | 11111-1 | 11111-1 | the data block Wk' is only written in the counter if its value is greater than the previous value Wk.

In addition to the risk of global erasing of the memory area with UV light, the risk of fraud on the counter also includes the risk of corrupting the process of reading the previous data block Wk so that the latter is read as being lower than the next data block Wk' even when that is not the case, which enables the counting value present in the counter to be decreased. The risk of fraud also includes the risk of corrupting the process of writing the new data block, to write a lower counting value after the performance of the comparison step.

Thus, the mere comparison of the previous value of the data block to be refreshed before the writing of the data block in the memory area is not sufficient to overcome the risk of fraud.

According to one embodiment and as shown in FIG. 2, control memory cells are added to the memory area MZ so that at least two control bits CB0, CB1 are associated with each data block. As represented, memory cells CEL0$k$, CEL1$k$ receiving the control bits CB0, CB1 are preferentially added on the right and on the left of each location of a data block, formed by a group of memory cells C0$k$-C15$k$.

Before being put into operation, the counter is initialized so that the two control bits CB0, CB1 associated with each data block have opposite values, either 0 and 1 or 1 and 0. This operation is performed in a test mode and can no longer be carried out once the counter is put into operation.

When the data block Wk must be replaced with the new data block Wk', the data block Wk and the control bits CB0, CB1 associated with this block are read, as schematically represented by a "READ" step.

The two control bits CB0, CB1 are compared with each other to check whether or not they are different, for example by means of an XOR (EXCLUSIVE OR) gate that supplies an error signal ERR1 equal to 1 if the two bits are different or equal to 0 (active value) if the two bits are equal.

Simultaneously, the new data block Wk' is compared with the data block Wk read in the memory area, for example by means of a binary comparator BCOMP that supplies an error signal ERR2 equal to 1 if the value of the data block Wk' is greater than the value of the data block Wk (case of counter with increasing values), or equal to 0 (active value) in the opposite case.

If one or other of the error signals ERR1, ERR2 is equal to 0, the writing operation is cancelled. Otherwise, the operation of writing the data block Wk' is performed. As an advantageous option, the writing of the data block Wk' is accompanied by the writing in the two control memory cells of two new control bits CB0', CB1' each having a value that is the opposite of that of the corresponding control bit CB0, CB1 previously read in the memory area (CB0'=/CB0, CB1'=/CB1). The control bits CB0', CB1' are for example supplied by inverter gates I0, I1 that receive at input the control bits CB0, CB1, respectively. This step of re-writing the two control bits by inverting their respective values enables the control memory cells to be refreshed and any premature ageing thereof or an alteration of the values of the control bits by retention loss phenomenon to be overcome, while keeping the duality of values between the two control bits.

The method according to one embodiment thus offers triple protection:

1) protection against corruption of the read process, that will be detected by the fact that the control bits will have the same value when they are read, 2) protection against corruption of the writing process, that will be detected by the fact that the control bits will have the same value when they are written, and therefore also when they are subsequently read, 3) protection against global erasing of the memory area, that will also be detected by the fact that the control bits will have the same value when they are read.

As a result, the method according to one embodiment can be applied to the securization of a memory in various applications other than the management of a binary counter, in which the step of comparing the new data block Wk' and the previous data block Wk is not implemented.

FIG. 3 shows an example of implementation of the method according to one embodiment in an integrated circuit IC comprising an electrically erasable and programmable EEPROM-type memory. The memory classically comprises a memory array MA, a line decoder RDEC selecting the word lines of the memory array, a column decoder CDEC selecting groups of bit lines of the memory array (columns), a programming circuit PCT and a read circuit RCT.

The memory is designed here to be read- and write-accessible per 16-bit data block, or per pair of bytes. In the memory array MA, one word line (physical page of the memory) is reserved for the management of a binary counter CMPT.

Each word line comprises for example 16 data blocks, each of 16 bits. Instead of providing 16×16, i.e., 256 memory cells per physical page, 16×18, i.e., 288 memory cells in each word line, i.e., sixteen columns, each of eighteen bit lines are provided here, in order to associate two control memory cells CEL0k, CEL1k with each data block Wk contained in sixteen memory cells C0k-C15k.

In a corresponding manner, the read circuit RCT comprises eighteen sense amplifiers instead of sixteen. More particularly, sixteen sense amplifiers SA0-SA15 are provided to simultaneously read a data block, one sense amplifier CSA0 is provided to read the first control bit CB0 of the data block and one sense amplifier CSA1 is provided to read the second control bit CB1 of the data block. The sense amplifiers CSA0, SA0-SA15, CSA1 are linked to the memory array through read transistors RT, a multiplexing bus MXB and a selecting circuit SELCT linking the bus MXB to the bit lines of the memory array. The read transistors RT are put into the transmission state by a signal RD that is active in read mode of the memory array.

Again in a corresponding manner, the programming circuit PCT comprises eighteen programming latches instead of sixteen. Sixteen programming latches L0-L15 are provided to simultaneously program sixteen bits in a data block, one programming latch CL0 is provided to program the first control bit CB0 associated with the data block and one programming latch CL1 is provided to program the second control bit CB1 associated with the data block. The programming latches CL0, L0-L15, CL1 are linked to the memory array through the multiplexing bus MXB and the selecting circuit SELCT. They are activated by a signal WR that is active in write mode of the memory array.

The selecting circuit SELCT comprises sixteen groups of eighteen column selecting transistors TSC driven by column selecting signals SCOLk (k=0 to 15) supplied by the decoder CDEC, each of the signals SCOLk being dedicated to the activation of a group of column selecting transistors TSC. Thus, in read mode, eighteen bit lines of a column out of the 16×18 bit lines of the memory array are linked to the sense amplifiers CSA0, SA0-SA15, CSA1 when one of the signals SCOLk selects the column by putting the transistors TSC allocated to the selection of this column into the transmission state. Similarly, in write mode, eighteen bit lines of a column out of the 16×18 bit lines of the memory array are linked to the latches CL0, L0-L15, CL1 when one of the signals SCOLk selects the column by putting the corresponding transistors TSC into the transmission state.

The integrated circuit also comprises a control circuit CTCT, an address register AREG with serial input and parallel output, an input data register IREG with serial input and parallel output, an output data register OREG with parallel input and serial output. The elements described above enabling the method according to one embodiment to be implemented are also provided, i.e., the inverter gates I0, I1, the XOR gate the output of which supplies the signal ERR1 and the comparator BCOMP the output of which supplies the signal ERR2.

The control circuit CTCT, for example a hard-wired logic sequencer, manages all the elements of the memory to execute commands for reading and writing the memory array. It comprises a serial input/output linked to a serial SPI-type (Serial Peripheral Interface) bus whereby it receives read or write commands and particularly a specific command WRITECMPT for writing the counter CMPT, of the type:

<CODE(WRITECMPT), RANK, NVAL>, comprising the code of the command, the rank of the data block to be written in the counter (ranging here from 0 to 15) and the new value to be written NVAL.

The circuit CTCT comprises an internal output linked to the serial input of the register IREG, another internal output linked to the serial input of the register AREG and an internal input linked to the serial output of the register OREG.

The parallel output of the register IREG, of 16 bits, is linked firstly to a first input of the comparator BCOMP and secondly to the input of the programming circuit. More particularly, each output wire conveying a data bit present in the register IREG is linked to one of the programming latches L0-L15.

The read circuit RCT comprises a parallel output of 18 bits corresponding to the juxtaposition of the outputs of the sense amplifiers SA0-SA15 and of the sense amplifiers CSA0, CSA1.

The control bits CB0, CB1 supplied by the sense amplifiers CSA0, CSA1 are sent firstly to the inputs of the inverter gates I0, I1, and secondly to the inputs of the XOR gate. The output of the gate I0, supplying the control bit CB0'=/CB0, is applied to the input of the latch CL0 while the output of the gate I1, supplying the control bit CB1'=/CB1, is applied to the input of the latch CL1.

The sixteen data bits supplied by the sense amplifiers SA0-SA15 form a data block Wk that is sent firstly to a second input of the comparator BCOMP and secondly to the parallel input of the register OREG.

The operation of the integrated circuit IC in response to a write command of the counter received on the SPI bus in one embodiment comprises the following steps, shown by the flow chart in FIG. 4, of:

Step S1) receiving a command WRITECMPT: the control circuit CTCT receives and decodes the command, then saves the new value received NVAL in the register IREG, forming the data block Wk' to be written.

Step S2) preparing the reading of the data block Wk: the circuit CTCT loads into the address register AREG an address for selecting the data block of the counter CMPT designated by the parameter RANK present in the command. This address comprises most significant bits designating the word line (physical page of the memory array receiving the counter) that are applied to the line decoder RDEC, and least significant bits designating the column of the memory array in which the targeted data block is located, which are applied to the column decoder CDEC.

Step S3) reading the data block Wk: the circuit CTCT applies a read voltage to the memory array, activates all the sense amplifiers of the read circuit RCT. The current value AVAL of the data block Wk that must be replaced by the value NVAL of the new data block Wk' is then applied to the comparator BCOMP (the latter receiving at its other input the value NVAL present in the register IREG) and the current values of the control bits CB0, CB1 are applied to the XOR gate. Optionally, the circuit CTCT loads the block Wk into the output register OREG to subsequently retransmit it to the SPI bus in the event of refusal to write. The error bit ERR1 changes to 0 (active value) if the bits CB0, CB1 are equal and the error bit ERR2 changes to 0 if the new value NVAL is not greater than the current value AVAL of the data block Wk (it is assumed as above that the counter is managed by increasing values).

Step S4) testing the error signals: the circuit CTCT tests the error signals ERR1, ERR2. If at least one of the two signals is equal to 0, the circuit CTCT goes to step S5 described below. Otherwise, the circuit CTCT goes to step S6.

Step S5) the circuit CTCT refuses to execute the command for writing the value NVAL and sends an error message back to the SPI bus. Optionally, the type of error (ERR1 or ERR2) is indicated. Again optionally, the error message is accompanied by the value AVAL (to justify the refusal) if the refusal is due to the signal ERR2 changing to 0.

Step S6) the circuit CTCT activates the programming latches L0-L15 and CL0, CL1 so that the data block Wk' of value NVAL of the data block is loaded into the latches L0-L15, and the inverted control bits CB0'=/CB0, CB1'=/CB1 supplied by the gates I1, I2 are loaded into the latches CL0, CL1. The control circuit then applies to the decoders RDEC, CDEC and to the memory array MA the voltages required to erase the memory cells containing the data block selected, then applies to the decoders RDEC, CDEC and to the memory array MA the voltages required to program the memory cells containing the data block selected (only the memory cells that are to receive a programming logic value, for example 1, being programmed).

Step S7) the circuit CTCT sends back to the SPI bus a write confirmation optionally comprising the value AVAL replaced by the value NVAL.

It will be understood by those skilled in the art that various alternative embodiments are possible, such as concerning the size of the data blocks, the number of control bits that are associated with each data block (limited to two for the sake of simplicity in the example described above), the control means for controlling the control bits, or whether the counter has increasing or decreasing values. In particular, the method can be executed by a microprocessor under the control of a program, although this solution has a lower level of security due to the risks of fraud concerning the program itself (the level of security thus being maximal when the implementation is performed with hard-wired logic circuits).

Furthermore, the method may be applied to any type of memory array. In particular, although the control memory cells receiving the control bits CB0 CB1 are preferentially arranged along a word line, respectively on the right and on the left of the group of memory cells receiving the associated data block, other arrangements can be provided. For example, a region of the memory array can be reserved for the control memory cells, with one or more pairs per data block. It is however preferable to keep the control memory cells of a data block next to the memory cells receiving the data block in question, to more efficiently counter localized attacks only concerning a portion of the memory array, unless the architecture of the memory is based on an interleaving of memory cells (particularly FLASH memories).

Various applications of the described method may also be made. For example, in other embodiments, the method may be applied to the production of smart cards and integrated circuits for smart cards containing a transaction unit counter (that can also be a decreasing value counter, or "countdown counter").

Moreover, as indicated above, providing control bits offers triple protection and enables, in addition to corruption of the write process or of the read process, global erasing of the memory array (UV erasing for example) to be detected. As a result, other embodiments can be used to write- and read-protect a memory array, independently of the application of a binary counter.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method, comprising:
    associating respective pluralities of control bits with plural data blocks, respectively, of a memory area;
    before writing a new data block in the memory area,
        reading in the memory area the control bits associated with a current data block, of the plural data blocks, intended to be replaced with the new data block, and
        beginning a securing action for securing the memory area if the control bits have the same value; and
    upon each write of a new data block in the memory area,
        simultaneously writing in the memory area control bits having opposite values, each control bit written in the memory area during the writing of a new data block has a value that is opposite of that of the corresponding control bit read in the memory area before the writing of the new data block.

2. The method according to claim 1, wherein the securing action includes preventing the new data block from being written in the memory area.

3. The method according to claim 1, wherein the securing action includes supplying an error signal or an error message.

4. The method according to claim 1, wherein the control bits associated with one of the plural data blocks are written in memory cells that are contiguous to a group of memory cells receiving the associated data block.

5. The method according to claim 1, wherein a memory cell receiving a control bit is arranged at one end of a group of memory cells receiving an associated data block and a memory cell receiving the other control bit is arranged at another end of the group of memory cells receiving the associated data block.

6. The method according to claim 1, comprising a step of initializing the memory area involving writing in the memory area groups of control bits, each group associated respectively with the plural data blocks, by giving the control bits of a same group opposite values.

7. The method of claim 1 further comprising before the writing of a new data block in the memory area, reading in the memory area the current data block and beginning a securing action for securing the memory area if the value of the new data block is not different from the value of the current data block according to a determined variation direction of a counter.

8. A method, comprising:
breaking down a string of bits into a plurality of data blocks, the string of bits forming a binary counter;
associating respective pluralities of control bits with plural data blocks, respectively, of a memory area;
before writing each new data block from the plurality of data blocks in the memory area,
reading in the memory area the control bits associated with a current data block, of the plural data blocks, intended to be replaced with the new data block, and beginning a securing action for securing the memory area if the control bits have the same value;
upon each write of a new data block in the memory area, simultaneously writing in the memory area control bits having opposite values; and
before the writing of each new data block from the plurality of data blocks in the memory area,
simultaneously reading in the memory area the current data block and the associated control bits, and
beginning the securing action for securing the memory area if at least one of the following conditions is encountered:
the control bits have the same value, or
the value of the new data block is not different from the value of the current data block according to a determined variation direction of the counter.

9. An electronic circuit comprising:
a secured memory area comprising groups of memory cells each receiving a data block; and
means for executing a write command for writing a data block in a group of memory cells designated by the command,
wherein the memory area comprises:
for each data block, two control memory cells associated with the group of memory cells receiving the data block, the control memory cells being contiguous to the group of memory cells receiving the associated data block; and
securing means arranged for:
before writing a new data block in a group of memory cells designated by a command, reading the control memory cells associated with the group of memory cells, and beginning a securing action for securing the memory area if two bits read in the control memory cells have the same value; and
upon each write of a data block in a group of memory cells designated by a command, simultaneously writing in the control memory cells associated with the group of memory cells two bits having opposite values.

10. The electronic circuit according to claim 9, wherein the securing means are arranged for, upon each write of a data block in a group of memory cells, writing in each control memory cell associated with the group of memory cells, a bit having a value that is the opposite of that of the bit read in the control memory cell before the writing of the data block.

11. The electronic circuit according to claim 9, wherein the securing means are arranged for beginning a securing action that prevents the data block from being written in the memory area.

12. The electronic circuit according to claim 9, wherein the securing means are arranged for beginning a securing action comprising the supply of an error signal or of an error message.

13. The electronic circuit according to claim 9, wherein a control memory cell is arranged at one end of the associated group of memory cells and a memory cell receiving the other control bit is arranged at another end of the associated group of memory cells.

14. The electronic circuit according to claim 9, comprising a string of bits forming a binary counter, broken down into a plurality of data blocks, and means for managing the binary counter including said securing means.

15. The electronic circuit according to claim 14, wherein the means for managing the binary counter are configured to:
before each write of a new data block in a group of memory cells designated by a command,
reading the group of memory cells designated by the command and the control memory cells associated with the group of memory cells, and
beginning the securing action for securing the memory area if at least one of the two following conditions is encountered:
two bits present in the control memory cells have the same value, or
the value of the new data block is not different from the current value of the data block read in the group of memory cells according to a determined variation direction of the counter.

16. The electronic circuit of claim 9, wherein the electronic circuit is integrated in a semiconductor chip.

17. The electronic circuit of claim 9, further comprising electronic counter means for counting using the data blocks.

18. A smart card including an integrated circuit comprising:
a secured memory area comprising groups of memory cells each receiving a data block;
means for executing a write command for writing a data block in a group of memory cells designated by the command;
wherein the memory area comprises:
for each data block, two control memory cells associated with the group of memory cells receiving the data block,
securing means arranged for:

before writing a new data block in a group of memory cells designated by a command, reading the control memory cells associated with the group of memory cells, and beginning a securing action for securing the memory area if two bits read in the control memory cells have the same value; and upon each write of a data block in a group of memory cells designated by a command, simultaneously writing in the control memory cells associated with the group of memory cells two bits having opposite values, each control bit written in the memory area during the writing of a new data block has a value that is opposite to that of the corresponding control bit read in the memory area before the writing of the new data block.

19. The smart card of claim 18 wherein the securing action includes preventing the new data block from being written in the memory area.

20. A smart card including an integrated circuit comprising a secured memory area comprising groups of memory cells each receiving a data block;

means for executing a write command for writing a data block in a group of memory cells designated by the command;

wherein the memory area comprises:
  for each data block, two control memory cells associated with the group of memory cells receiving the data block,
  securing means arranged for:
    before writing a new data block in a group of memory cells designated by a command, reading the control memory cells associated with the group of memory cells, and beginning a securing action for securing the memory area if two bits read in the control memory cells have the same value;
    upon each write of a data block in a group of memory cells designated by a command, simultaneously writing in the control memory cells associated with the group of memory cells two bits having opposite values; and
    before the writing of a new data block in the memory area, reading in the memory area the current data block and beginning a securing action for securing the memory area if the value of the new data block is not different from the value of the current data block according to a determined variation direction of a counter.

21. A computer-readable memory medium, containing instructions that, when executed, performs a method comprising:

associating respective pluralities of control bits with plural data blocks, respectively, of a memory area; and before writing a new data block in the memory area,
  reading in the memory area the control bits associated with a current data block of the plural data blocks intended to be replaced with the new data block, and
  beginning a securing action for securing the memory area if the control bits have the same value, each control bit written in the memory area during the writing of a new data block has a value that is opposite of that of the corresponding control bit read in the memory area before the writing of the new data block.

22. The computer-readable medium of claim 21 wherein the method further comprises upon each write of a new data block in the memory area, simultaneously writing in the memory area control bits having opposite values.

23. The computer-readable medium of claim 21 wherein the method further comprises before the writing of a new data block in the memory area, reading in the memory area the current data block and beginning a securing action for securing the memory area if the value of the new data block is not different from the value of the current data block according to a determined variation direction of a counter.

24. The smart card of claim 20 wherein the securing action includes preventing the new data block from being written in the memory area.

* * * * *